United States Patent
Pallinti et al.

(10) Patent No.: US 6,951,808 B2
(45) Date of Patent: *Oct. 4, 2005

(54) METAL PLANARIZATION SYSTEM

(75) Inventors: Jayanthi Pallinti, Santa Clara, CA (US); Samuel V. Dunton, San Jose, CA (US); Ronald J. Nagahara, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 10/400,278

(22) Filed: Mar. 27, 2003

(65) Prior Publication Data

US 2004/0018719 A1 Jan. 29, 2004

Related U.S. Application Data

(63) Continuation of application No. 09/804,783, filed on Mar. 13, 2001, now Pat. No. 6,586,326.

(51) Int. Cl.$^7$ .......................................... H01L 21/4763
(52) U.S. Cl. ....................................................... 438/626
(58) Field of Search ................................ 438/584, 597, 438/618, 626, 631, 633, 637, 645, 672, 675, 691, 694, 697, 622, 624, 628, 634, 639, 648, 650, 656, 678, 683, 685–688; 257/734, 741, 750, 762, E23.161, E21.174, E21.175, E21.583

(56) References Cited

U.S. PATENT DOCUMENTS

| | | | | |
|---|---|---|---|---|
| 6,083,835 A | * | 7/2000 | Shue et al. | 438/687 |
| 6,117,781 A | * | 9/2000 | Lukanc et al. | 438/692 |
| 6,391,780 B1 | * | 5/2002 | Shih et al. | 438/692 |
| 6,403,469 B1 | * | 6/2002 | Tsai et al. | 438/633 |
| 6,429,118 B1 | * | 8/2002 | Chen et al. | 438/629 |
| 6,461,675 B2 | * | 10/2002 | Paranjpe et al. | 427/250 |
| 6,586,326 B2 | * | 7/2003 | Pallinti et al. | 438/626 |
| 2002/0053656 A1 | * | 5/2002 | Miller et al. | 252/79 |

* cited by examiner

Primary Examiner—George Fourson
Assistant Examiner—Brook Kebede
(74) Attorney, Agent, or Firm—Luedeka, Neely & Graham, P.C.

(57) ABSTRACT

A method for restoring an eroded portion in an exposed upper surface cavity of a metallic element in a microelectronic device, where the metallic element has a hardness, and the metallic element is laterally surrounded by lateral elements, where at least one structure within the lateral elements has a hardness that is greater than the hardness of the metallic element. A precursor material is deposited in at least the cavity of the upper surface of the metallic element. The precursor material is deposited to a thickness that at least fills the cavity of the upper surface of the metallic element. The precursor material has a hardness that is less than the hardness of the at least one structure within the lateral elements. The precursor material is removed as necessary from the lateral elements, and the precursor material is planarized. Only the precursor material within the cavity of the upper surface of the metallic element is selectively replaced with a desired material. The eroded portion of the metallic element is thereby restored. By removing precursor material from those areas in which no replacement with the desired material is wanted, the desired material is selectively deposited only in those place where the precursor material remains, and where it is desired to fill in the cavities or dishing that was created in the areas of the softer metallic elements between the harder laterally surrounding elements during a prior chemical mechanical polishing process. Thus, the microelectronic device is more fully planarized, as the dishing is filled in, and the metallic element is supplemented with an additional amount of desired material.

11 Claims, 1 Drawing Sheet

METAL PLANARIZATION SYSTEM

This is a continuation of application Ser. No. 09/804,783, filed Mar. 13, 2001, now U.S. Pat. No. 6,586,326.

FIELD

This invention relates to the field of microelectronic circuitry fabrication. More particularly the invention relates to a system for planarizing metallic features in a microelectronic circuit.

BACKGROUND

As microelectronic devices get increasingly smaller, new problems with fabricating the devices appear. For example, microelectronic devices are typically fabricated by a process where different layers that provide specialized functions are deposited, patterned, and etched, and then subsequent layers are deposited over the top of the resultant structure, and the process continues in this manner for several layers until the microelectronic device is completed.

Because the different deposited layers are patterned and etched, the upper surface of the microelectronic device is made very uneven. This roughness of the upper surface of the microelectronic device is enhanced as each successive layer is deposited over a previously patterned layer, and then it too is patterned and overlaid with subsequent layers.

At a time when microelectronic devices occupied a relatively large surface area, this condition was not too much of a problem, as the various layers could be deposited to a thickness that was sufficient to overcome the size of the steps that were created during the patterning process. Alternately, the various structures could be formed at a distance from each other that was sufficiently far apart that the various steps of the structures did not interfere to too great an extent with each other.

However, as the surface area in which a microelectronic device is fabricated has been reduced, the steps caused by the successive layers have become more of a problem. One aspect of this problem is that it becomes increasingly difficult to adequately deposit successive layers within the deep crevices that tend to be formed between the successive patterned structures. Further, the rough topography of these resultant microelectronic devices tends to induce stress points within the layers, which tend to reduce the microelectronic device's resistance to failure in certain operating conditions and environments.

To counteract these problems, microelectronic devices are typically planarized to some extent and in some manner before successive layers are deposited on underlying layers. This is often accomplished with a process known as chemical mechanical polishing. In this process, the surface of the substrate on which the microelectronic devices are formed is abraded mechanically against a polishing pad, typically with the application of a slurry that also chemically erodes the surface of the substrate. This controlled chemical mechanical polishing tends to wear away those points on the upper surface of the substrate that are higher than other points, and thereby planarizes the microelectronic devices.

Unfortunately, chemical mechanical polishing tends to erode materials that are softer away from the surface of the substrate at a rate that is greater than the erosion of materials that are harder. As the surface of a microelectronic device typically has different structures of different materials exposed at the top surface at any given point during its fabrication, those structures that are formed of softer materials tend to erode at a rate that is greater than their neighboring structures that are formed of harder materials.

This difference in the rate of erosion of various structures at the surface of the microelectronic device tends to work against the general goal of planarizing the surface of the microelectronic device, because the softer structures tend to be eroded to a level that is below the level of the harder structures. This typically appears in a cross section as a cavity at the top surface of the softer structures between the laterally surrounding harder structures. This condition can also be described as a dishing of the softer structures between the laterally surrounding harder structures, because the erosion of the softer structures tends to be somewhat greater near the centers of the upper surfaces of the softer structures, and somewhat less near the edges of the upper surfaces of the softer structures where the laterally surrounding harder structures tend to offer some protection from various aspects of the chemical mechanical polishing process.

As a specific example, copper elements that are deposited on the surface of a microelectronic device tend to be softer than the laterally surrounding elements, such as oxide. After chemical mechanical polishing, the copper structures, such as lead lines, tend to be dished between the laterally surrounding oxide elements. Thus, at least two undesirable conditions are presented. First, the planarization is not optimal, because the surface of the copper structures tends to be below the surface of the laterally surrounding oxide elements. Second, the copper structures might no longer be deposited to the desired thickness.

What is needed, therefore, is a system for reducing the problems with chemical mechanical polishing as described above.

SUMMARY

The above and other needs are met by a method for restoring an eroded portion in an exposed upper surface cavity of a metallic element in a microelectronic device, where the metallic element has a hardness, and the metallic element is laterally surrounded by lateral elements, where at least one structure within the lateral elements has a hardness that is greater than the hardness of the metallic element. A precursor material is deposited in at least the cavity of the upper surface of the metallic element. The precursor material is deposited to a thickness that at least fills the cavity of the upper surface of the metallic element.

The precursor material has a hardness that is less than the hardness of the at least one structure within the lateral elements. The precursor material is removed as necessary from the lateral elements, and the precursor material is planarized. Only the precursor material within the cavity of the upper surface of the metallic element is selectively replaced with a desired material. The eroded portion of the metallic element is thereby restored.

By removing precursor material from those areas in which no replacement with the desired material is wanted, the desired material is selectively deposited only in those place where the precursor material remains, and where it is desired to fill in the cavities or dishing that was created in the areas of the softer metallic elements between the harder laterally surrounding elements during a prior chemical mechanical polishing process. Thus, the microelectronic device is more fully planarized, as the dishing is filled in, and the metallic element is supplemented with an additional amount of desired material.

In various preferred embodiments, the metallic element and the desired material are both copper, the at least one structure within laterally surrounding elements is oxide, and the precursor material is amorphous silicon, that is most preferably deposited using plasma enhanced chemical vapor deposition. The selective replacement of the desired material is preferably accomplished by dipping in a plating solution of about 7.5 grams per liter of cupric sulfate in about a one percent solution of buffered oxide etch.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
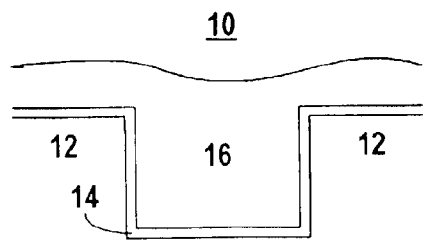
FIG. 1 is a cross sectional view of an element in which a metallic substance has been deposited.

Referring now to FIG. 1 there is depicted a cross sectional view of a metallic element 16 that has been deposited within a microelectronic device 10. In the specific example where the metallic structure 16 is to be a copper conductor, a barrier layer 14 preferably protects the metallic element 16 from the laterally surrounding features, such as oxide elements 12. As can be seen in FIG. 1, the metallic material, such as copper, is preferably deposited over the entire surface of the microelectronic device 10, so as to fill in all such structures 16 where the metallic material is desired.

Figure 2:
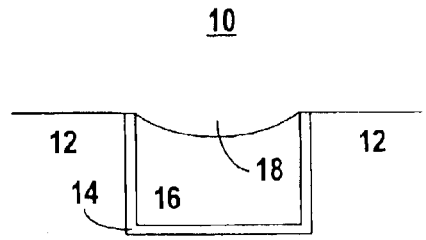
FIG. 2 is a cross sectional view of the metallic element after chemical mechanical polishing, showing the eroded portion of the metallic element.

FIG. 2 depicts the metallic element 16 after chemical mechanical polishing, where a cavity 18 has been formed at the top surface of the metallic element 16. As can be seen in FIG. 2, the cavity 18 has a dished cross sectional shape, where the edges of the cavity 18 near the laterally surrounding elements 12 tend to be more nearly at the same level as the laterally surrounding elements 12 and the center of the cavity 18 tends to be at a lower level. It is desired to remediate the dishing effect so as to restore the metallic element 16 and more effectively planarize the microelectronic circuit 10.

Figure 3:
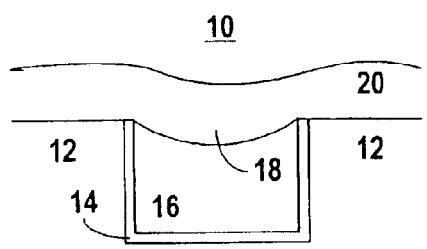
FIG. 3 is a cross sectional view of the metallic element over which a precursor material has been deposited.

FIG. 3 depicts the microelectronic circuit 10 after the structure depicted in FIG. 2 has been cleaned and a layer of a precursor material 20 has been deposited over the surface of the microelectronic device 10. Although the precursor material 20 is preferably desired in only those areas in which remediation of elements such as the metallic element 16 is desired, it tends to be much easier to deposit the precursor material 20 over substantially the entire surface of the microelectronic device 10 and then selectively remove the precursor material 20 from those areas, such as elements 12, at which the precursor material 20 is not desired.

In the most preferred embodiment, as introduced above, where the metallic element 16 is copper, the precursor material 20 is preferably amorphous silicon that is deposited with a plasma enhanced chemical vapor deposition. However, it is appreciated that this is by way of example only, and that in other embodiments, other systems of metallic elements 16, precursor materials 20, deposition techniques, and other processes as described below can be used.

Figure 4:
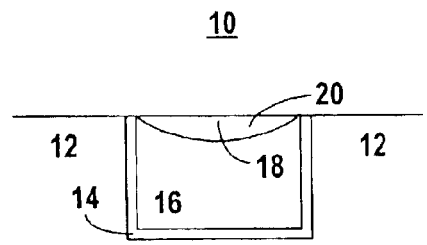
FIG. 4 is a cross sectional view of the metallic element after the precursor material has been removed from the laterally surrounding elements and planarized.

FIG. 4 depicts the microelectronic device 10 after the precursor material 20 has been selectively removed from the laterally surrounding elements 12 and planarized over the metallic element 16. In a most preferred embodiment, this is accomplished in a single step by chemically mechanically polishing the amorphous silicon, which simultaneously removes the amorphous silicon from the silicon oxide 12 and planarizes the amorphous silicon over the copper element 16.

Figure 5:
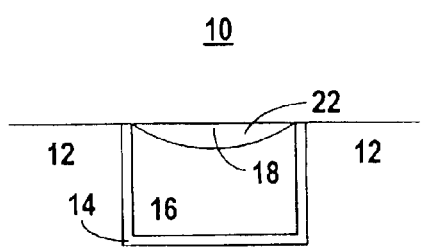
FIG. 5 is a cross sectional view of the metallic element after the precursor material has been replaced with the desired material.

In FIG. 5, the precursor material 20 depicted in FIG. 4 has been replaced with the desired material 22. This is preferably accomplished with an electrochemical oxidation reduction reaction. In the preferred embodiment, the microelectronic device 10 is dipped in a solution that contains copper, which replaces the amorphous silicon 20 in a chemical reaction. Most preferably, a solution of about 7.5 grams per liter of cupric sulfate in a 1% solution of buffered oxide etch is used as the plating solution. All of the amorphous silicon 20 is preferably replaced in this manner with copper 22.

Figure 6:
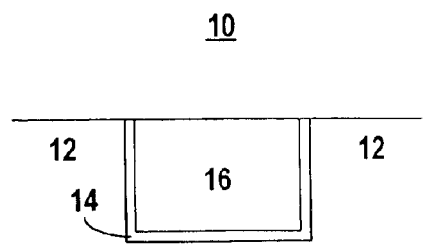
FIG. 6 is a cross sectional view of the metallic element after the eroded portion has been restored.

FIG. 6 depicts the microelectronic device 10 after an anneal, which preferably produces a restored metallic element 16, where the dished cavity that once existed at the top surface of the metallic element 16 has been filled in with the desired material 22. As explained above, it is most preferred that the material of the metallic element 16 and the desired material 22 be the same material. However, this is not limited to copper alone, but other materials such as aluminum, tungsten, etc. could also be used in this manner.

The anneal may be performed in more than one process segment. For example, there may be a preliminary anneal to cure the copper, and then the metallic element 16 can be touch polished using chemical mechanical polishing, to remove any overburden or excess material that may remain in the metallic element 16, and that causes it to extend above the surface of the laterally surrounding elements 12. If such a touch polish is performed, then the microelectronic device 10 is preferably cleaned to remove the debris of the chemical mechanical polishing process. A final anneal may then be selectively performed before the microelectronic device 10 is passed for further processing.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for forming planarized structures of a metallic element within recesses of a surface, the method comprising the steps of:

depositing the metallic element in at least the recesses of the surface, thereby at least completely filling the recesses with the metallic element, removing any deposited metallic element from the surface, thereby dishing upper surfaces of the deposited metallic element remaining within the recesses, depositing a precursor material in at least the dished upper surfaces of the deposited metallic element remaining within the recesses of the surface, where the precursor material is deposited to a thickness that at least fills the dished upper surfaces of the deposited metallic element remaining within the recesses of the surface, removing the precursor material from the surface, planarizing the precursor material, and selectively replacing with a desired material the precursor material within the dished upper surfaces of the metallic element remaining within the recesses of the surface, wherein the precursor material comprises amorphous silicon.

2. A method for forming planarized structures of a metallic element within recesses of a surface, the method comprising the steps of:

depositing the metallic element in at least the recesses of the surface, thereby at least completely filling the recesses with the metallic element, removing any deposited metallic element from the surface, thereby dishing upper surfaces of the deposited metallic element remaining within the recesses, depositing a precursor material in at least the dished upper surfaces of the deposited metallic element remaining within the recesses of the surface, where the precursor material is deposited to a thickness that at least fills the dished upper surfaces of the deposited metallic element remaining within the recesses of the surface, removing the precursor material from the surface, planarizing the precursor material, and selectively replacing with a desired material the precursor material within the dished upper surfaces of the metallic element remaining within the recesses of the surface, wherein the step of replacing the precursor material with a desired material comprises dipping in a displacement plating solution until all of the precursor material is replaced with the desired material.

3. A method for forming planarized structures of a metallic element within recesses of a surface, the method comprising the steps of:

depositing the metallic element in at least the recesses of the surface, thereby at least completely filling the recesses with the metallic element, removing any deposited metallic element from the surface, thereby dishing upper surfaces of the deposited metallic element remaining within the recesses, depositing a precursor material in at least the dished upper surfaces of the deposited metallic element remaining within the recesses of the surface, where the precursor material is deposited to a thickness that at least fills the dished upper surfaces of the deposited metallic element remaining within the recesses of the surface, removing the precursor material from the surface, planarizing the precursor material, and selectively replacing with a desired material all of the precursor material within the dished upper surfaces of the metallic element remaining within the recesses of the surface.

4. The method of claim 3 further comprising the steps of:

curing at least the desired material that replaced the precursor material with an anneal, removing any excess amount of the desired material that overburdens the dished upper surfaces of the metallic element remaining within the recesses of the surface, and annealing the planarized structures.

5. The method of claim 3, wherein the metallic element comprises copper.

6. The method of claim 3, wherein the precursor material comprises silicon.

7. The method of claim 3, wherein the step of depositing a precursor material comprises depositing the precursor material using plasma enhanced chemical vapor deposition.

8. The method of claim 3, wherein the step of planarizing the precursor material comprises chemically mechanically polishing the precursor material.

9. The method of claim 3, wherein the desired material comprises the metallic element.

10. The method of claim 3, wherein the precursor material comprises copper.

11. The method of claim 3, wherein the surface comprises a semiconductor device.

* * * * *